(12) United States Patent
Iida

(10) Patent No.: US 10,175,588 B2
(45) Date of Patent: Jan. 8, 2019

(54) DECOMPRESSION PROCESSING APPARATUS

(71) Applicant: DISCO CORPORATION, Tokyo (JP)

(72) Inventor: Hidekazu Iida, Tokyo (JP)

(73) Assignee: Disco Corporation, Tokyo (JP)

( * ) Notice: Subject to any disclaimer, the term of this patent is extended or adjusted under 35 U.S.C. 154(b) by 16 days.

(21) Appl. No.: 15/802,078

(22) Filed: Nov. 2, 2017

(65) Prior Publication Data

US 2018/0143544 A1    May 24, 2018

(30) Foreign Application Priority Data

Nov. 22, 2016 (JP) ................................. 2016-226894

(51) Int. Cl.
| | |
|---|---|
| *G03B 27/42* | (2006.01) |
| *G03F 7/20* | (2006.01) |
| *H01L 21/3065* | (2006.01) |
| *H01L 21/683* | (2006.01) |
| *H01L 21/67* | (2006.01) |

(52) U.S. Cl.
CPC ...... *G03F 7/70866* (2013.01); *G03F 7/70708* (2013.01); *H01L 21/3065* (2013.01); *H01L 21/67109* (2013.01); *H01L 21/6831* (2013.01)

(58) Field of Classification Search
CPC ........... G03F 7/70866; C23C 16/45551; C23C 16/45574; C23C 16/545; C23C 14/165; C23C 16/45565; C23C 16/4412; C23C 16/455; C23C 16/45525; C23C 16/45563; H01L 21/6719; H01L 21/2855
See application file for complete search history.

(56) References Cited

U.S. PATENT DOCUMENTS 6,511,895 B2 * 1/2003 Koma ............... H01L 21/02013
257/E21.214

FOREIGN PATENT DOCUMENTS

JP    2001-358097    12/2001

* cited by examiner

*Primary Examiner* — Mesfin Asfaw
(74) *Attorney, Agent, or Firm* — Greer Burns & Crain Ltd.

(57) ABSTRACT

Disclosed herein is a decompression processing apparatus for processing a wafer in a decompressed state including a chamber having a decompressing unit configured to decompress the inside of the chamber, an opening and closing door configured to open and close a carrying-in-and-out opening for carrying the wafer into and out of the chamber, and an inert gas supply source configured to supply an inert gas to the inside of the chamber. The inside of the chamber is maintained in a dry state by continuing to supply the inert gas in a state in which the opening and closing door is opened.

1 Claim, 3 Drawing Sheets

DECOMPRESSION PROCESSING APPARATUS

BACKGROUND OF THE INVENTION

Field of the Invention

The present invention relates to a decompression processing apparatus that decompresses the inside of a decompression chamber when processing a wafer.

Description of the Related Art

A grinding trace remains on a ground surface of a wafer after being ground by a grinding apparatus. This grinding trace causes a decrease in transverse rupture strength of the wafer. Accordingly, an apparatus has been proposed which removes the grinding trace from the ground surface of the wafer by plasma etching (see Japanese Patent Laid-Open No. 2001-358097, for example). In a plasma etching apparatus, the wafer is carried into a chamber (decompression chamber) from the outside via an opening and closing door, and an etching gas is supplied to the inside of the chamber in a state in which the inside of the chamber is decompressed. Then, the grinding trace is removed from the ground surface by making the etching gas converted into plasma react on the wafer. A decrease in transverse rupture strength which decrease is caused by the grinding trace of the ground wafer is thereby suppressed.

SUMMARY OF THE INVENTION

The wafer carried into the chamber is mounted on an electrostatic chuck (holding table), held by the electrostatic chuck, and plasma-etched. The plasma etching raises the temperature of the wafer. The wafer is therefore cooled by passing cooling water through the electrostatic chuck. After the plasma etching is completed, the chamber is opened to the atmosphere to carry out the wafer. The outside air enters the inside of the chamber, and humidity rises within the chamber. When moisture included in the outside air is cooled by the cooled electrostatic chuck, condensation forms on the surface of the electrostatic chuck, so that a sufficient sticking force for the wafer is not obtained. Further, because a volume ratio of steam to water is 1700 times, when the humidity within the chamber rises, the humidity hinders decompression of the inside of the chamber, and thus decompression time is lengthened.

It is accordingly an object of the present invention to provide a decompression processing apparatus that can prevent the occurrence of condensation and which can shorten decompression time.

In accordance with an aspect of the present invention, there is provided a decompression processing apparatus for processing a wafer in a decompressed state, the decompression processing apparatus including a holding table configured to hold a wafer, a decompression chamber in which the holding table is disposed, an opening and closing door configured to open and close a carrying-in-and-out opening through which the wafer is carried into and carried out of the decompression chamber, and inert gas supplying means for supplying an inert gas to the decompression chamber. A positive pressure with respect to an outside air is generated in the decompression chamber by supplying the inert gas to an inside of the decompression chamber by the inert gas supplying means, the opening and closing door is opened, and the inside of the decompression chamber is maintained in a dry state by continuing to supply the inert gas to the inside of the decompression chamber by the inert gas supplying means until the opening and closing door is closed.

According to this constitution, the inert gas generates a positive pressure within the decompression chamber, and therefore the inert gas is discharged from the inside of the decompression chamber to the outside via the carrying-in-and-out opening when the opening and closing door is opened. At this time, the inert gas continues to be supplied to the inside of the decompression chamber, and therefore the inert gas continues to be discharged from the carrying-in-and-out opening. Hence, the outside air does not enter the inside of the decompression chamber from the carrying-in-and-out opening against the flow of the inert gas, and the inert gas maintains the inside of the decompression chamber in a dry state. Because humidity within the decompression chamber is not raised by the outside air when the wafer is carried into and carried out of the decompression chamber, condensation can be prevented from forming on the holding table. In addition, the decompression time can be shortened by suppressing the effect of moisture, which hinders decompression.

According to the present invention, the opening and closing door is opened while the inert gas continues to be supplied to the inside of the decompression chamber. Thus, the outside air does not enter the inside of the decompression chamber from the carrying-in-and-out opening, and the inert gas maintains the inside of the decompression chamber in a dry state. Hence, the occurrence of condensation can be prevented, and the decompression time can be shortened.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
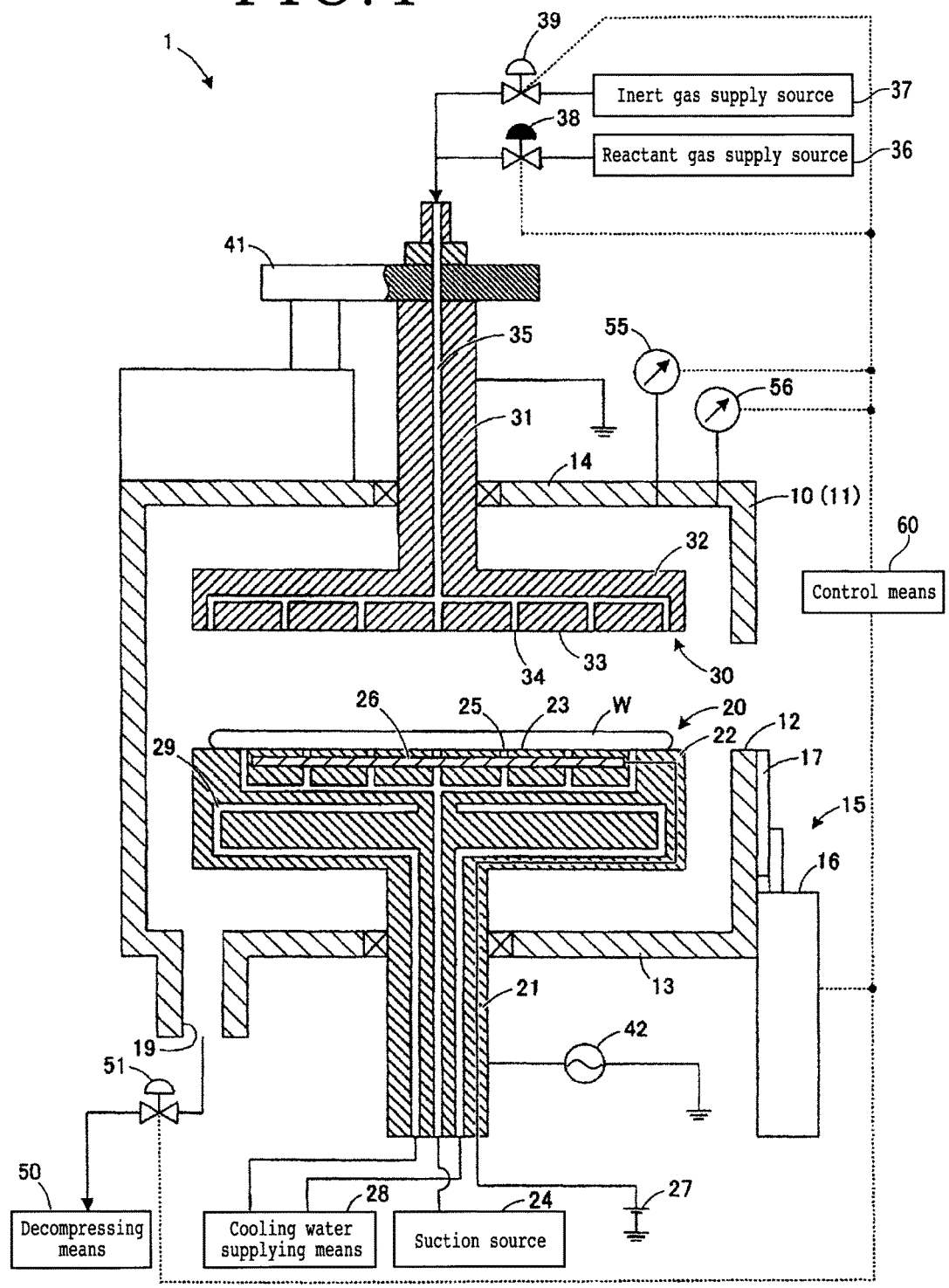
FIG. 1 is a general schematic diagram of an etching apparatus according to a present embodiment.

An etching apparatus as a decompression processing apparatus will hereinafter be described with reference to the accompanying drawings. FIG. 1 is a general schematic diagram of an etching apparatus according to the present embodiment. Incidentally, while description will be made by illustrating a plasma etching apparatus for capacitive coupled plasma (CCP) as a decompression processing apparatus in the present embodiment, the decompression processing apparatus may be various other kinds of plasma etching apparatuses such as a plasma etching apparatus for inductive coupled plasma (ICP) and the like. In addition, it suffices for the decompression processing apparatus to be an apparatus processing a wafer in a decompressed state. The decompression processing apparatus may be, for example, a film forming apparatus that grows a film on the top surface of a wafer.

As depicted in FIG. 1, an etching apparatus 1 is configured to convert a reactant gas (etching gas) into plasma within a chamber (decompression chamber) 10, and remove a grinding trace remaining on a wafer W after grinding by plasma etching. The wafer W is a semiconductor wafer of silicon (Si), gallium arsenide (GaAs), or the like formed in substantially the shape of a disk. The wafer W is carried into the etching apparatus 1 after the undersurface side of the wafer W is ground by grinding. Incidentally, while a semiconductor wafer is illustrated as the wafer W in the present embodiment, the wafer W is not limited to semiconductor wafers, but may be anything as long as the wafer W is a processing object.

In an ordinary etching apparatus, the temperature of the wafer W rises during plasma etching, and therefore the wafer W is cooled by passing a cooling water through a holding table. The temperature of the holding table at this time is approximately 70° C. When the plasma etching is completed, the temperature of the wafer W is decreased, and therefore the holding table reaches a cooling water temperature, that is, approximately 20° C. When the chamber is thereafter opened to the atmosphere to carry out the wafer W, moisture included in the outside air is cooled by the holding table, and condensation forms on the holding table, so that the wafer W cannot be stuck sufficiently.

In addition, in the etching apparatus, the inside of the chamber is decompressed before the plasma etching. However, each time the wafer W is carried in or carried out, the outside air enters the inside of the chamber, and the inside of the chamber returns to an atmospheric pressure. Less moisture is preferable for decompression of the inside of the chamber. However, the moisture included in the outside air as described above and moisture adhering to the wafer W enter the inside of the chamber, and cause a decompression time to be prolonged. It is possible to maintain the inside of the chamber in a decompressed state by forming a constitution in which the wafer W can be carried in and carried out without the inside of the chamber being opened to the outside. However, large-scale equipment is necessary in the etching apparatus 1.

The etching apparatus is usually disposed in a clean room. However, even the outside air in the clean room has moisture with a humidity of approximately 30%. Therefore, even in the clean room, the outside air having the humidity enters the inside of the chamber while the wafer W is carried in or carried out, so that the decompression time is lengthened. In addition, consideration has recently been given to a composite apparatus referred to as a cluster type apparatus in which an etching apparatus is disposed together with another processing apparatus such as a grinding apparatus or the like. When an etching apparatus is disposed next to a grinding apparatus, there is a fear that the outside air having moisture with a humidity of 60% to 80% enters the inside of the chamber from the grinding apparatus, and that the decompression time is thus further lengthened.

Accordingly, with attention directed to the fact that humidity within the chamber causes condensation to occur and causes the decompression time to be prolonged, the etching apparatus 1 according to the present embodiment maintains a dry state by continuing to supply an inert gas to the inside of the chamber. This eliminates an increase in humidity within the chamber 10 while the wafer W is carried in and carried out, and thereby reduces condensation and shortens the decompression time. In addition, continuing to supply the inert gas eliminates changing of a gas from a dry air to the inert gas, and can correspondingly shorten processing time more than in a case where the inside of the chamber is maintained in a dry state using the dry air.

A detailed configuration of the etching apparatus 1 according to the present embodiment will be described in the following. A carrying-in-and-out opening 12 for carrying in and carrying out the wafer W is formed in a side wall 11 of the chamber 10 of the etching apparatus 1. Opening and closing means 15 for opening and closing the carrying-in-and-out opening 12 is attached to an outside wall surface of the side wall 11. The opening and closing means 15 has an opening and closing door 17 coupled to an upper end of a cylinder 16. The cylinder 16 raises and lowers the opening and closing door 17 along the outside wall surface, whereby the carrying-in-and-out opening 12 is opened and closed. When the carrying-in-and-out opening 12 is opened, the inside of the chamber 10 is opened to the outside. When the carrying-in-and-out opening 12 is closed, the inside of the chamber 10 is sealed.

A lower electrode unit 20 and an upper electrode unit 30 forming an electric field are arranged so as to be spaced and opposed to each other at a predetermined interval in a vertical direction within the chamber 10. The lower electrode unit 20 includes a conductive support portion 21 penetrating a bottom wall 13 of the chamber 10, and a conductive holding table 22 disposed at an upper end of the support portion 21. A holding surface 23 for temporarily fixing the wafer W by a vacuum chuck is formed as an upper surface of the holding table 22. A large number of suction openings 25 connected to a suction source 24 are formed in the holding surface 23. A suction force is supplied to the suction openings 25, and the wafer W is temporarily fixed by a negative pressure generated on the holding surface 23.

In addition, a holding electrode 26 for finally fixing the wafer W by an electrostatic chuck is embedded in the holding table 22. The holding electrode 26 is connected to a direct-current power supply 27. The wafer W is sucked and held by static electricity generated on the holding surface 23 when a voltage is applied to the holding electrode 26. Incidentally, the holding electrode 26 may be formed with either of a unipolar structure and a bipolar structure. In addition, the wafer W may be held on the holding surface 23 by one of the vacuum chuck or the electrostatic chuck in place of the constitution in which the wafer W is temporarily fixed by the vacuum chuck and the wafer W is finally fixed by the electrostatic chuck.

In addition, a cooling passage 29 through which a cooling water sent out from cooling water supplying means 28 passes is formed within the lower electrode unit 20. During etching, heat generated in the holding table 22 is transmitted to the cooling water to suppress an abnormal temperature rise. Incidentally, while the cooling water is illustrated as a refrigerant, the heat may be absorbed from the holding table 22 by another refrigerant.

The upper electrode unit 30 includes a conductive support portion 31 penetrating a top wall 14 of the chamber 10, and a jetting table 32 disposed at a lower end of the support portion 31. A jetting surface 33 jetting a reactant gas or an inert gas into the chamber 10 is formed as a bottom surface of the jetting table 32. A large number of injecting openings 34 are formed in the jetting surface 33. The injecting openings 34 are connected with a reactant gas supply source 36 and an inert gas supply source (inert gas supplying means) 37 through a flow passage 35 within the jetting table 32 and the support portion 31. Supply valves 38 and 39 are arranged in the middle of pipe passages of the reactant gas supply source 36 and the inert gas supply source 37. Switching between the gas supply sources is performed by the supply valves 38 and 39.

Used as the reactant gas is, for example, a fluorine-based stable gas including fluorine, such as sulfur hexafluoride ($SF_6$), methane tetrafluoride ($CF_4$), nitrogen trifluoride ($NF_3$), or the like. In addition, used as the inert gas is, for example, nitrogen ($N_2$), helium (He), or argon (Ar).

An upper end side of the support portion 31 of the upper electrode unit 30 projects upward from the chamber 10, and is coupled to ball screw type raising and lowering means 41 disposed on the top wall 14 of the chamber 10. When the raising and lowering means 41 is driven, the upper electrode unit 30 is brought away from or close to the lower electrode unit 20, and the height of the jetting table 32 is adjusted to an appropriate position with respect to the wafer W on the holding table 22. The lower electrode unit 20 is connected to a high-frequency power supply 42. The upper electrode unit 30 is grounded. The reactant gas is converted into plasma when a high-frequency voltage is applied between the lower electrode unit 20 and the upper electrode unit 30.

The chamber 10 has an exhaust port 19 formed below the holding table 22. Decompressing means 50 is connected to the exhaust port 19 via an exhaust valve 51. The decompressing means 50 is a so-called turbo molecular pump (TMP). The inside of the chamber 10 is decompressed when the decompressing means 50 exhausts the inert gas or the reactant gas from the inside of the chamber 10. In addition, the chamber 10 is provided with a positive pressure gage 55 and a negative pressure gage 56 as pressure gages. The positive pressure gage 55 detects a positive pressure state within the chamber 10 when the wafer W is carried in and carried out. The negative pressure gage 56 detects a decompression state within the chamber 10 during plasma etching.

The etching apparatus 1 is further provided with control means 60 for performing centralized control of each part of the apparatus. The control means 60 controls opening and closing timing of the opening and closing door 17, the supply valves 38 and 39, and the exhaust valve 51, an operation of carrying in the wafer W, processing operation for plasma etching, and the like. Incidentally, the control means 60 is formed by a processor performing various kinds of processing, a memory, and the like. The memory is formed by one or a plurality of storage media such as a read only memory (ROM), a random access memory (RAM), and the like according to an application. The memory stores, for example, a program and the like for controlling the various kinds of processing of the etching apparatus 1.

In the thus formed etching apparatus 1, the inert gas continues to be supplied to the inside of the chamber 10 when the wafer W is carried in and carried out. The inside of the chamber 10 thereby has a positive pressure, so that the outside air is prevented from entering the inside of the chamber 10. Because the wafer W is carried in and carried out while the inside of the chamber 10 remains maintained in a dry state, a decompression time before plasma etching is shortened, and the occurrence of condensation is prevented. Then, in a state in which the chamber 10 is decompressed, the reactant gas is injected from the upper electrode unit 30 toward the wafer W. When a high-frequency voltage is applied between the upper electrode unit 30 and the lower electrode unit 20 in this state, the reactant gas is converted into plasma, and the wafer W is etched.

Figure 2A:
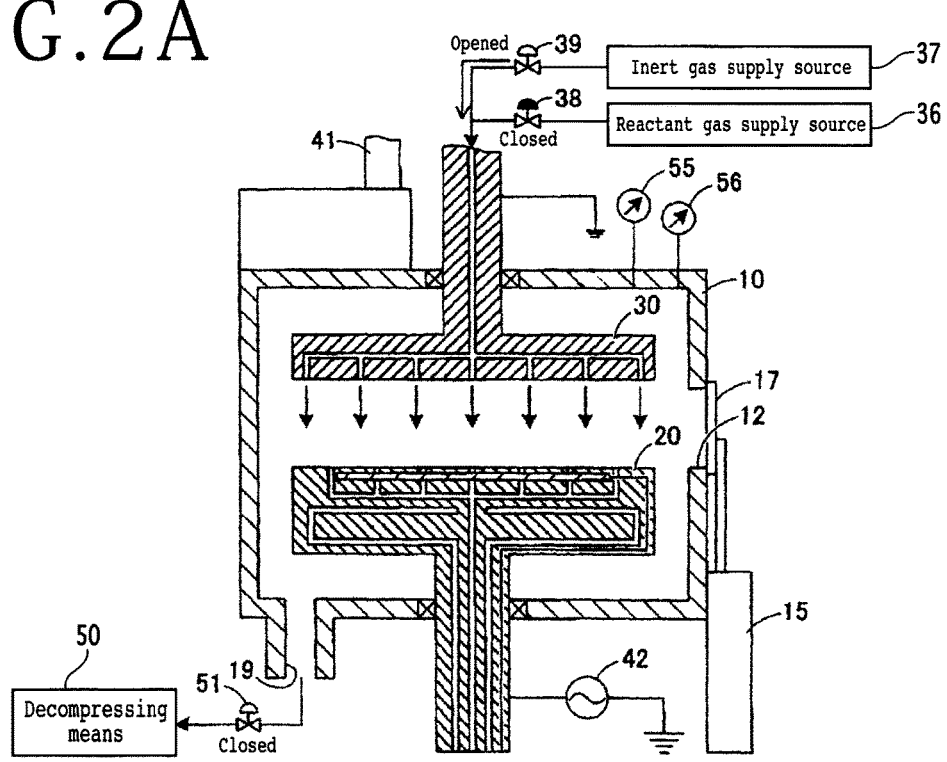
FIGS. 2A and 2B are diagrams of assistance in explaining an operation of carrying in a wafer according to the present embodiment.
Figure 2B:
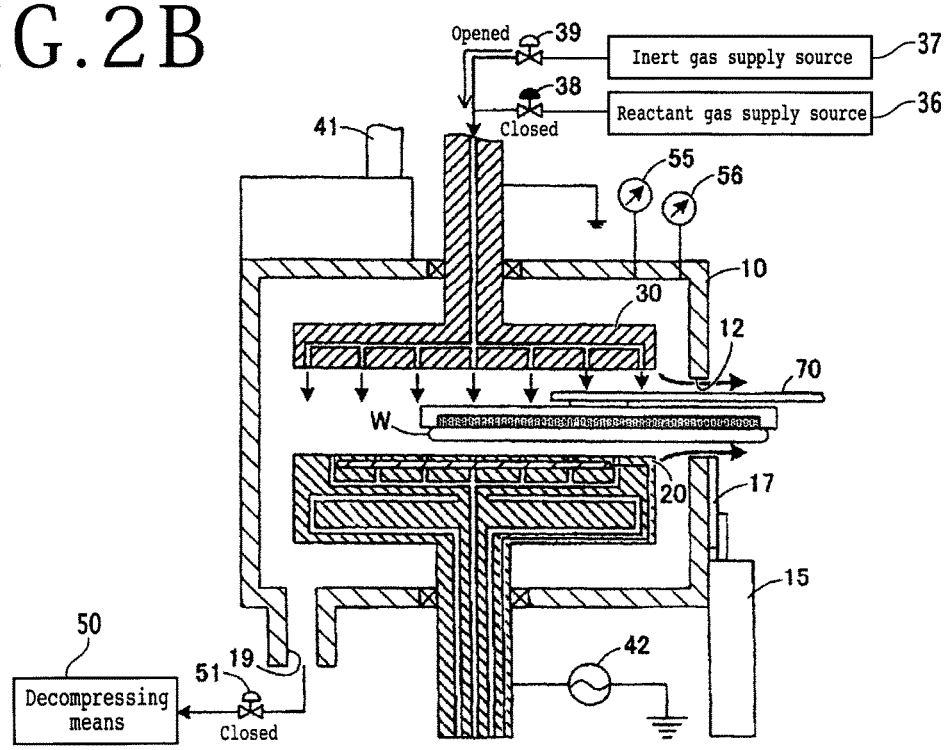
Figure 3A:
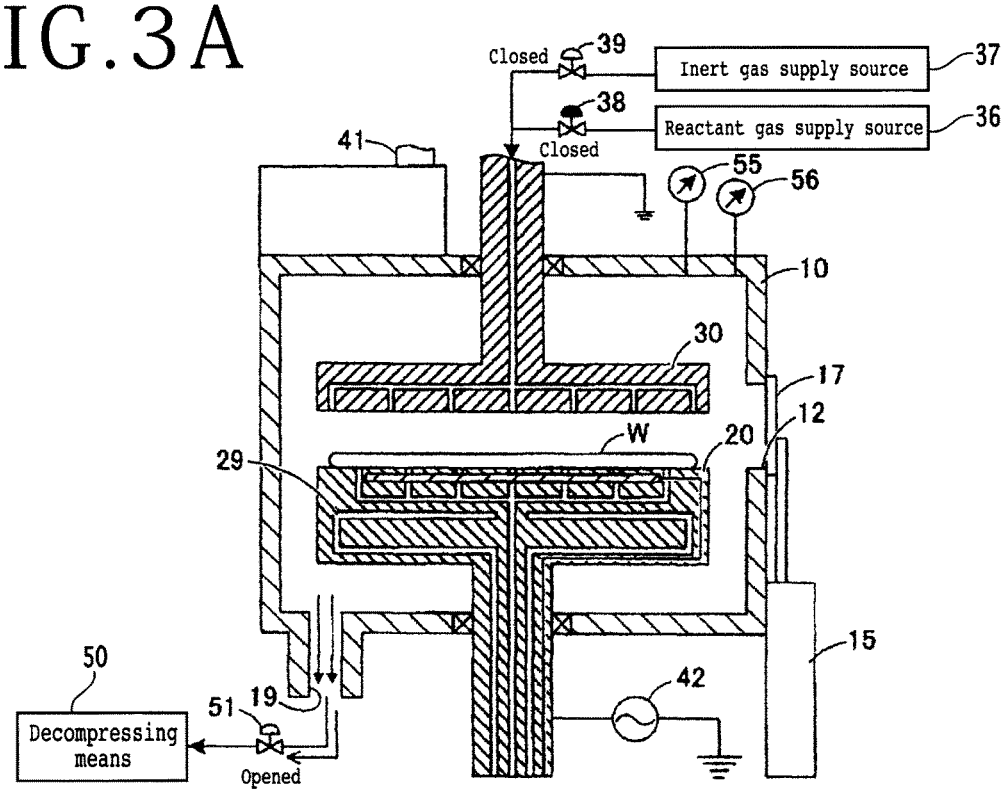
FIGS. 3A and 3B are diagrams of assistance in explaining an etching operation by the etching apparatus according to the present embodiment.
Figure 3B:
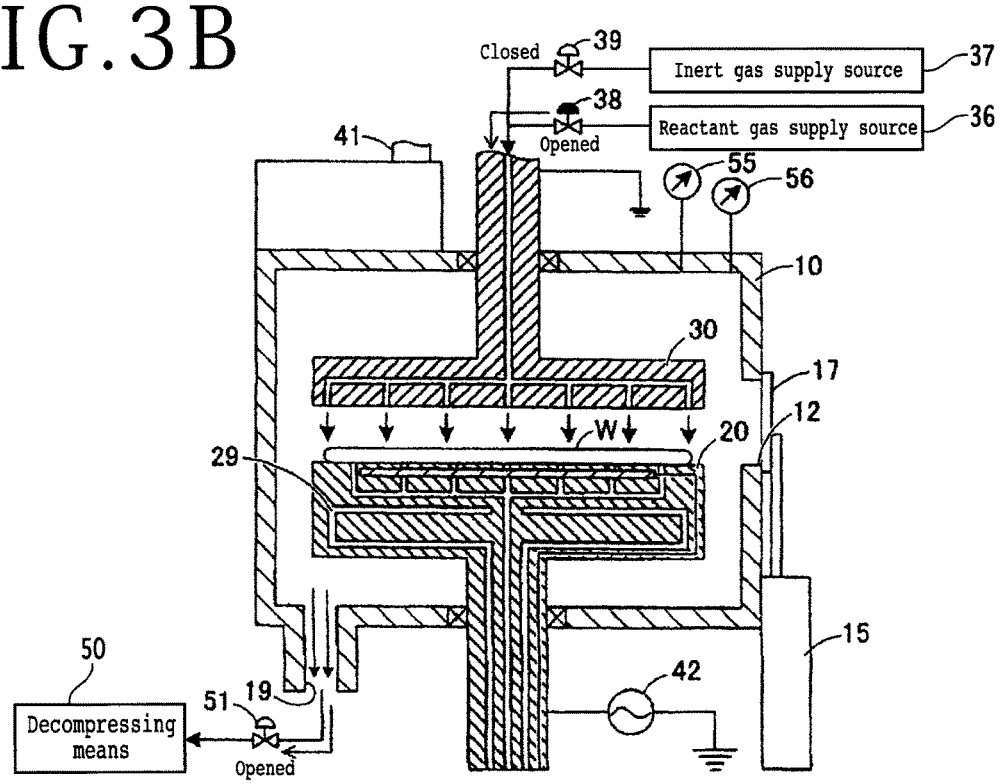

A wafer carrying-in operation and an etching operation will be described in the following with reference to FIGS. 2A and 2B and FIGS. 3A and 3B. FIGS. 2A and 2B are diagrams of assistance in explaining a wafer carrying-in operation according to the present embodiment. FIGS. 3A and 3B are diagrams of assistance in explaining an etching operation by the etching apparatus. It is to be noted that the carrying-in operation and the etching operation according to the present embodiment are mere examples, and can be changed as appropriate. In addition, while the wafer carrying-in operation will be described with reference to FIGS. 2A and 2B, a wafer carrying-out operation is performed in a similar manner.

As depicted in FIG. 2A, before the wafer W (see FIG. 2B) is carried in, the carrying-in-and-out opening 12 is closed by the opening and closing door 17, and therefore a sealed space is formed within the chamber 10. In a state in which the chamber 10 is sealed, the control means 60 (see FIG. 1) opens the supply valve 39 for the inert gas supply source 37 to supply the inert gas from the upper electrode unit 30 to the inside of the chamber 10. When the inert gas continues to be supplied to the inside of the chamber 10, the inside of the chamber 10 has a positive pressure, and a dry state is maintained. Incidentally, during the supply of the inert gas, the exhaust valve 51 connected to the exhaust port 19 is closed, and therefore the inert gas within the chamber 10 is not exhausted through the exhaust port 19.

As depicted in FIG. 2B, when the positive pressure gage 55 detects a positive pressure equal to or higher than a predetermined value within the chamber 10, the control means 60 (see FIG. 1) opens the opening and closing door 17, so that the inside of the chamber 10 is opened to the outside through the carrying-in-and-out opening 12. At this time, the inside of the chamber 10 has a positive pressure higher than the outside, and therefore the inert gas within the chamber 10 is discharged to the outside via the carrying-in-and-out opening 12. Because the inert gas continues to be supplied from the inert gas supply source 37 to the inside of the chamber 10, the inert gas is blown out from the carrying-in-and-out opening 12 to the outside. Hence, even when the opening and closing door 17 for the carrying-in-and-out opening 12 is opened, the outside air does not enter the inside of the chamber 10 against the flow of the inert gas.

Then, a transfer robot 70 provided outside the etching apparatus 1 carries an already ground wafer W into the chamber 10. At this time, moisture may remain on the wafer W itself. However, the moisture of the wafer W is sufficiently removed by exposing the wafer W to a dry environment before the carrying-in-and-out opening 12 is closed by the opening and closing door 17. After the carrying in of the wafer W is completed, the control means 60 seals the inside of the chamber 10 by closing the carrying-in-and-out opening 12 by the opening and closing door 17, and stops the supply of the inert gas by closing the supply valve 39. The dry state within the chamber 10 is maintained by thus continuing to supply the inert gas until the operation of carrying in the wafer W is completed.

As depicted in FIG. 3A, when the carrying in of the already ground wafer W is completed, an inter-electrode distance is adjusted by bringing the upper electrode unit 30 close to the lower electrode unit 20. In addition, the control means 60 (see FIG. 1) opens the exhaust valve 51, and the decompressing means 50 performs vacuum exhaustion until the pressure within the chamber 10 reaches a negative-pressure state. At this time, even when the inside of the chamber 10 has a positive pressure due to the inert gas, decompression can be achieved in a short time because of little moisture within the chamber 10. In this decompressed state, the control means 60 opens the supply valve 38 for the reactant gas supply source 36, so that the reactant gas is injected from the upper electrode unit 30.

As depicted in FIG. 3B, the reactant gas is converted into plasma (radical) by applying a high-frequency voltage between the upper electrode unit 30 and the lower electrode unit 20 in the state in which the reactant gas is injected from the upper electrode unit 30 to the wafer W. The reactant gas converted into plasma dry etches (isotropically etches) a ground surface of the wafer W due to a radical chain reaction. Consequently, a grinding trace is removed from the ground surface of the wafer W, and transverse rupture strength is improved. At this time, because the etching is performed in a state in which the moisture remaining on the wafer W is sufficiently removed, formation of hydrofluoric acid (HF) due to reaction between the reactant gas and water is suppressed, so that corrosion of the apparatus can be prevented.

In addition, during the etching, the control means 60 (see FIG. 1) passes a cooling water from the cooling water supplying means 28 (see FIG. 1) to the cooling passage 29 to suppress a temperature rise due to the etching of the wafer W mounted on the lower electrode unit 20. At a time of an end of the etching, the cooling water within the cooling passage 29 sharply cools the lower electrode unit 20. At this time, even when the opening and closing door 17 is opened and the wafer W is carried out, the continuous supply of the inert gas prevents the outside air including moisture from entering the inside of the chamber 10. Thus, condensation can be prevented from forming within the chamber 10.

As described above, according to the etching apparatus 1 in accordance with the present embodiment, the inert gas generates a positive pressure within the chamber 10, and therefore the inert gas is discharged from the inside of the chamber 10 to the outside via the carrying-in-and-out opening 12 when the opening and closing door 17 is opened. At this time, the inert gas continues to be supplied to the inside of the chamber 10, and therefore the inert gas continues to be discharged from the carrying-in-and-out opening 12. Hence, the outside air does not enter the inside of the chamber 10 from the carrying-in-and-out opening 12 against the flow of the inert gas, and the inert gas maintains the inside of the chamber 10 in a dry state. Because humidity within the chamber 10 is not raised by the outside air when the wafer W is carried into and carried out of the chamber 10, condensation can be prevented from forming within the chamber 10. In addition, the decompression time can be shortened by suppressing the effect of moisture, which hinders decompression.

Incidentally, in the present embodiment, description has been made of a configuration in which the decompression processing apparatus is applied to an etching apparatus. However, the embodiment is not limited to this configuration. The decompression processing apparatus is applicable to apparatuses that process a wafer W in a decompressed state, and is applicable also to, for example, film forming apparatuses such as a film forming apparatus that forms a film on a wafer by a chemical vapor deposition (CVD) method, a sputtering apparatus that forms a film on a wafer by a physical vapor deposition (PVD) method, a vacuum deposition apparatus, an ion plating apparatus, and the like as well as doping apparatuses such as a plasma doping apparatus, a laser doping apparatus, and the like that dope the inside of a wafer with an impurity.

In addition, the foregoing embodiment has a configuration in which a wafer is carried into the chamber after the inert gas generates a positive pressure within the chamber in a state in which the inside of the chamber is sealed. However, the embodiment is not limited to this configuration. The inert gas may continue to be supplied to the inside of the chamber in a state in which the inside of the chamber is opened to the outside.

In addition, in the foregoing embodiment, description has been made of a configuration in which the inside of the chamber is decompressed when a wafer after grinding is etched. However, the foregoing embodiment is not limited to this configuration. For example, the inside of the chamber may be decompressed when a wafer after being divided by a cutting blade or the like is etched. While the embodiment of the present invention has been described, the foregoing embodiment and modifications thereof may be wholly or partially combined with each other as other embodiments of the present invention.

The embodiment of the present invention are not limited to the foregoing embodiment and modifications thereof, but may be changed, replaced, or modified in various manners without departing from the spirit of the technical concept of the present invention. Further, when the technical concept of the present invention can be realized in a different manner by the progress of a technology or another derived technology, the technical concept of the present invention may be implemented by using the method. Hence, the claims cover all of embodiments that can be included in the scope of the technical concept of the present invention. In the present embodiment, description has been made of a configuration in which the present invention is applied to an etching apparatus. However, the present invention is also applicable to other processing apparatuses that need decompression.

As described above, the present invention has effects of being able to prevent the occurrence of condensation and being able to shorten the decompression time, and is useful particularly for decompression processing apparatuses that decompress the inside of a chamber before etching a wafer.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A decompression processing apparatus for processing a wafer in a decompressed state, the decompression processing apparatus comprising:
    a holding table configured to hold the wafer;
    a decompression chamber in which the holding table is disposed, the decompression chamber having an exhaust port;
    an opening and closing door configured to open and close a carrying-in-and-out opening through which the wafer is carried into and carried out of the decompression chamber;
    a reactant gas supply source for supplying reactant gas to the decompression chamber and a first supply valve;
    an inert gas source for supplying an inert gas to the decompression chamber and a second supply valve;
    decompressing means connected to the exhaust port for exhausting the inert gas from the decompression chamber; and
    a processor programmed to maintain a positive pressure in the decompression chamber with respect to an outside air by supplying the inert gas to an inside of the decompression chamber by opening the second supply valve and closing the exhaust port, the opening and closing door being opened, and the inside of the decompression chamber being maintained in a dry state by continuing to supply the inert gas to the inside of the decompression chamber by the inert gas source until the opening and closing door is closed, the exhaust port being then opened to exhaust the inert gas.

* * * * *